US009025063B2

(12) United States Patent
Ahn et al.

(10) Patent No.: US 9,025,063 B2
(45) Date of Patent: May 5, 2015

(54) UNIT PIXEL OF IMAGE SENSOR AND PIXEL ARRAY INCLUDING THE UNIT PIXEL

(71) Applicant: Samsung Electronics Co., Ltd., Suwon-si (KR)

(72) Inventors: Jung Chak Ahn, Yongin-si (KR); Hisanori Ihara, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 151 days.

(21) Appl. No.: 13/778,763

(22) Filed: Feb. 27, 2013

(65) Prior Publication Data
US 2013/0321685 A1 Dec. 5, 2013

(30) Foreign Application Priority Data

May 31, 2012 (KR) ........................ 10-2012-0058559

(51) Int. Cl.
| | | |
|---|---|---|
| H04N 3/14 | (2006.01) | |
| H04N 5/335 | (2011.01) | |
| H01L 31/062 | (2012.01) | |
| H01L 31/113 | (2006.01) | |
| H01L 27/146 | (2006.01) | |
| H01L 21/00 | (2006.01) | |
| H04N 5/374 | (2011.01) | |
| H04N 5/3745 | (2011.01) | |

(52) U.S. Cl.
CPC ........... *H04N 5/374* (2013.01); *H04N 5/37457* (2013.01); *H01L 27/14603* (2013.01); *H01L 27/14609* (2013.01); *H01L 27/14614* (2013.01); *H01L 27/1463* (2013.01); *H01L 27/1464* (2013.01); *H01L 27/14641* (2013.01)

(58) Field of Classification Search
CPC . H04N 5/359; H04N 5/3745; H04N 5/37457; H01L 27/14643; H01L 27/14645; H01L 27/1463; H01L 27/14641

USPC .................. 348/294, 300, 301, 302, 308; 257/290–1, 444, 446, 447; 250/208.1
See application file for complete search history.

(56) References Cited

U.S. PATENT DOCUMENTS

| | | | |
|---|---|---|---|
| 6,657,665 B1 | 12/2003 | Guidash | |
| 7,193,258 B2 * | 3/2007 | Hara et al. | 257/291 |
| 7,405,437 B2 | 7/2008 | Shim et al. | |
| 7,492,027 B2 * | 2/2009 | Mouli | 257/446 |
| 7,868,365 B2 | 1/2011 | Hara et al. | |
| 7,964,929 B2 * | 6/2011 | Fan | 257/443 |
| 8,531,567 B2 * | 9/2013 | Roy et al. | 348/308 |
| 2006/0038252 A1 * | 2/2006 | Mouli | 257/446 |
| 2009/0266973 A1 * | 10/2009 | Roy et al. | 250/206 |
| 2011/0084322 A1 | 4/2011 | Kang | |
| 2013/0307040 A1 * | 11/2013 | Ahn et al. | 257/292 |

FOREIGN PATENT DOCUMENTS

| | | |
|---|---|---|
| KR | 20020017797 | 3/2002 |
| KR | 20060020411 | 3/2006 |
| KR | 20080024807 | 3/2008 |

* cited by examiner

*Primary Examiner* — Daniel M Pasiewicz
(74) *Attorney, Agent, or Firm* — Onello & Mello, LLP

(57) ABSTRACT

A unit pixel of an image sensor is provided. The unit pixel includes a photoelectric conversion element configured to generate photocharge varying with the intensity of incident light, a transfer transistor configured to transfer the photocharge to a floating diffusion in response to a transfer control signal, and a supplemental transistor connected to the floating diffusion. Because the unit pixel includes only one transistor in addition to the transfer transistor, the area of the unit pixel is minimized, and, as a result, the resolution of a pixel array is increased and the power consumption of the pixel array is decreased.

12 Claims, 13 Drawing Sheets

UNIT PIXEL OF IMAGE SENSOR AND PIXEL ARRAY INCLUDING THE UNIT PIXEL

CROSS-REFERENCE TO RELATED APPLICATIONS

This application claims priority under 35 U.S.C. §119(a) from Korean Patent Application No. 10-2012-0058559 filed on May 31, 2012, the disclosure of which is hereby incorporated by reference in its entirety.

BACKGROUND

Embodiments in accordance with principles of inventive concepts relate to a unit pixel of an image sensor and a pixel array including the unit pixel, and more particularly, to a unit pixel for increasing the resolution of an image sensor by having an area minimized.

Complementary metal oxide semiconductor (CMOS) image sensors are solid image pick-up, or capture, devices using CMOS. CMOS image sensors have lower manufacturing cost, smaller size and consume less power than charge-coupled device (CCD) image sensors, which require a high-voltage analog circuit. Furthermore, the performance of CMOS image sensors has continuously improved, and therefore, CMOS image sensors have found widespread use in electronic products, including portable devices such as smart phones and digital cameras.

A pixel array included in CMOS image sensors includes a photoelectric conversion element in each pixel. The photoelectric conversion element generates an electrical signal varying with the quantity of incident light. CMOS image sensors may process the electrical signal to synthesize an image. With the recent demand on high-resolution images, it is desired to miniaturize pixels in CMOS image sensors.

SUMMARY

According to exemplary embodiments in accordance with principles of inventive concepts, there is provided a unit pixel of an image sensor. The unit pixel includes a photoelectric conversion element configured to generate photocharge varying with the intensity of incident light; a transfer transistor to transfer the photocharge to a floating diffusion in response to a transfer control signal; a supplemental transistor connected to the floating diffusion; and a deep trench isolation (DTI) configured to electrically isolate the photoelectric conversion element, the transfer transistor, and the supplemental transistor from adjacent unit pixels.

A unit pixel in accordance with principles of inventive concepts may further include a ground connected to an end of the photoelectric conversion element and the photoelectric conversion element may fill in an area of the unit pixel except for the DTI. Additionally, the transfer transistor gate may be deeper than a top of the photoelectric conversion element. The supplemental transistor may be a transistor selected from the group consisting of a dummy transistor, a reset transistor, a drive transistor, and a select transistor.

In accordance with principles of inventive concepts a pixel array of an image sensor may include first and second pixels arranged in a matrix form, the first pixel including a first photoelectric conversion element to generate first photocharge varying with the intensity of light incident on the first photoelectric conversion element, a first transfer transistor configured to transfer the first photocharge to a floating diffusion in response to a first transfer control signal, and a first supplemental transistor connected to the floating diffusion; the second pixel including a second photoelectric conversion element configured to generate second photocharge varying with light intensity incident upon the second photoelectric conversion element, a second transfer transistor configured to transfer the second photocharge to the floating diffusion in response to a second transfer control signal, and a second supplemental transistor connected to the floating diffusion, wherein the first pixel and the second pixel are electrically isolated from each other by a deep trench isolation (DTI).

Additionally, the first supplemental transistor may be a reset transistor to reset the floating diffusion in response to one of a first reset control signal and a second reset control signal and the second supplemental transistor is a drive transistor configured to output a voltage signal to a source, the voltage signal corresponding to a potential of the floating diffusion.

In accordance with principles of inventive concepts, the first supplemental transistor may be an n-channel depression type transistor that maintains the floating diffusion at 0 V when neither of the first and second pixels is selected.

A pixel array in accordance with principles of inventive concepts may include third and fourth pixels; wherein the third pixel includes, a third photoelectric conversion element to generate third photocharge varying with the intensity of incident light, a third transfer transistor configured to transfer the third photocharge to the floating diffusion in response to a third transfer control signal, and a third supplemental transistor connected to the floating diffusion; wherein the fourth pixel includes, a fourth photoelectric conversion element to generate fourth photocharge varying with the intensity of incident light, a fourth transfer transistor configured to transfer the fourth photocharge to the floating diffusion in response to a fourth transfer control signal, and a fourth supplemental transistor connected to the floating diffusion; and wherein the first through fourth pixels are electrically isolated from one other by the DTI.

The first supplemental transistor may be a reset transistor to reset the floating diffusion in response to one of first through fourth reset control signals, the second supplemental transistor is a drive transistor configured to output a voltage signal to a source, the voltage signal corresponding to the potential of the floating diffusion, and the third supplemental transistor is a select transistor to output the voltage signal to a column line in response to one of first through fourth selection control signals.

In accordance with principles of inventive concepts, the fourth supplemental transistor may be a dummy transistor whose gate, drain and source are connected to a ground and the first through fourth pixels may be arranged in a matrix form or a linear form.

Additionally, the fourth supplemental transistor may be a drive transistor configured to output the voltage signal corresponding to the potential of the floating diffusion to a source; and a gate, drain and source of the second supplemental transistor are respectively connected to a gate, drain and source of the fourth supplemental transistor through a conductive line and the first through fourth pixels may be arranged in a matrix form or a linear form.

In accordance with principles of inventive concepts, an image sensor may include such an array.

In accordance with principles of inventive concepts, an image processing system, includes a plurality of unit pixel groups in an image array; an analog to digital converter to convert signals supplied by the unit pixels from analog signals to digital signals; and a signal processor to process the digital signals provided by the analog to digital converter, wherein each unit pixel group includes: a plurality of photoelectric conversion elements configured to generate photocharge varying with the intensity of incident light; a plurality of transfer transistors to transfer the photocharge from respective photoelectric conversion elements to respective floating diffusions in response to respective transfer control signals; a plurality of supplemental transistor connected to the respective floating diffusions; and a deep trench isolation (DTI) configured to electrically isolate respective photoelectric conversion elements, transfer transistors, and supplemental transistors from adjacent unit pixels.

In accordance with principles of inventive concepts, the floating diffusions of unit pixels within a group of unit pixels may be electrically connected to, and at the same potential as, one another.

Additionally, the supplemental transistor within the first and second unit pixels within a group of unit pixels may be connected as reset and drive transistors, respectively, for the group of unit pixels and the supplemental transistor within the third unit pixel within a group of unit pixels may be connected in parallel with the supplemental transistor within the second unit pixel as a drive transistor.

A camera may include an image processing system in accordance with principles of inventive concepts.

BRIEF DESCRIPTION OF THE DRAWINGS

The above and other features and advantages of inventive concepts will become more apparent by describing in detail exemplary embodiments thereof with reference to the attached drawings in which.

DETAILED DESCRIPTION OF THE EMBODIMENTS

Figure 1:
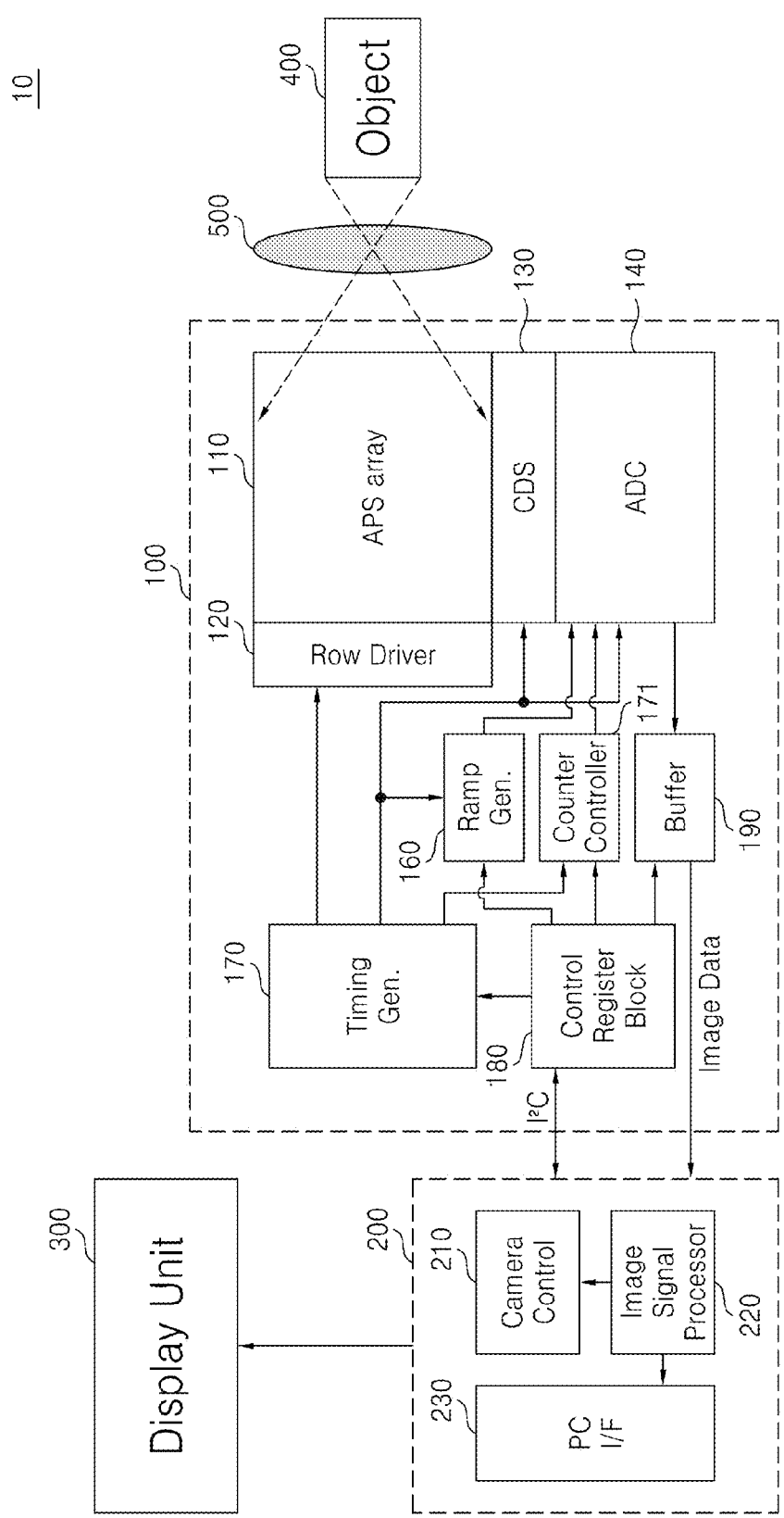
FIG. 1 is a block diagram of an image processing system including a unit pixel according to exemplary embodiments in accordance with principles of inventive concepts.

Exemplary embodiments in accordance with principles of inventive concepts will now be described more fully with reference to the accompanying drawings, in which exemplary embodiments are shown. Exemplary embodiments in accordance with principles of inventive concepts may, however, be embodied in many different forms and should not be construed as being limited to the embodiments set forth herein; rather, these embodiments are provided so that this disclosure will be thorough and complete, and will fully convey the concept of exemplary embodiments to those of ordinary skill in the art. In the drawings, the thicknesses of layers and regions may be exaggerated for clarity. Like reference numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (for example, "between" versus "directly between," "adjacent" versus "directly adjacent," "on" versus "directly on"). The word "or" is used in an inclusive sense, unless otherwise indicated.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "bottom," "below," "lower," or "beneath" other elements or features would then be oriented "atop," or "above," the other elements or features. Thus, the exemplary terms "bottom," or "below" can encompass both an orientation of above and below, top and bottom. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which exemplary embodiments in accordance with principles of inventive concepts belong. It will be further understood that teems, such as those defined in commonly-used dictionaries, should be interpreted as having a meaning that is consistent with their meaning in the context of the relevant art and will not be interpreted in an idealized or overly formal sense unless expressly so defined herein. Although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

FIG. 1 is a block diagram of an image processing system 100 including a unit pixel according to exemplary embodiments in accordance with principles of inventive concepts. The image processing system 10 may include an image sensor 100, an image processor (which may be implemented, for example, with a digital signal processor (DSP)) 200, a display unit 300, and a lens 500. In an exemplary embodiment in accordance with principles of inventive concepts, the image sensor 100 may include a pixel array (e.g., an active pixel sensor (APS) array) 110, a row driver 120, a correlated double sampling (CDS) block 130, an analog-to-digital converter (ADC) 140, a ramp generator 160, a timing generator 170, a counter controller 171, a control register block 180, and a buffer 190.

The image sensor 100 is controlled by image processor 200 to sense an object 400 captured through the lens 500. Image processor 200 may output an image, which has been sensed and output by the image sensor 100, to the display unit 300. The display unit 300 may be any device that can output an image, such as, for example, a computer, a mobile phone, or an electronic device including a camera.

In an exemplary embodiment in accordance with principles of inventive concepts, image processor 200 includes a camera control 210, an image signal processor 220, and a personal computer (PC) interface (I/F) 230. The camera control 210 controls the control register block 180. The camera control 210 may control the image sensor 100, and more specifically, the control register block 180 using an inter-integrated circuit (I²C), but the scope of inventive concepts is not restricted thereto.

The image signal processor 220 receives image data, that is, an output signal of the buffer 190, processes the image data into an image, and outputs the image to the display unit 300 through PC I/F 230.

In the exemplary embodiment in accordance with the principles of inventive concepts of FIG. 1, image signal processor 220 is a component of image processor; however, inventive concepts are not limited thereto. For example, in another exemplary embodiment in accordance with principles of inventive concepts, the image signal processor 220 may be a component of the image sensor 100.

The pixel array 110 includes a plurality of photo sensitive devices such as photo diodes (e.g., P-type, Intrinsic, N-type (PIN) diode). The pixel array 110 senses light using the photo sensitive devices and converts the light into an electrical signal to generate an image signal.

The timing generator 170 may output a control signal or a clock signal to the row driver 120, the ADC 140, the ramp generator 160, and the counter controller 171 to control the operations or the timing of the row driver 120, the ADC 140, the ramp generator 160, and the counter controller 171. The control register block 180 may output a control signal to the ramp generator 160, the timing generator 170, the counter controller 171, and the buffer 190 to control operations of the elements 160, 170, 171, and 190. The control register block 180 is controlled by the camera control 210.

The counter controller 171 may receive a control signal from the control register block 180 and transmit a counter control signal to a plurality of counters (not shown) included in the ADC 140.

The row driver 120 drives the pixel array 110 in units of rows. In an exemplary embodiment in accordance with principles of inventive concepts, the row driver 120 may generate a transfer control signal for controlling a transfer transistor of a unit pixel, a reset control signal for controlling a reset transistor, and a selection control signal for controlling a select transistor. The pixel array 110 outputs to the CDS block 130 a reset signal and an image signal from a row selected by a row selection signal received from the row driver 120. The CDS block 130 may perform CDS on the reset signal and the image signal.

The ADC 140 may compare a ramp signal output from the ramp generator 160 with a CDS signal output from the CDS block 130, generates a comparison result signal, counts the comparison result signal, and outputs a count result to the buffer 190.

The buffer 190 may temporarily store a digital signal output from the ADC 140 and sense and amplify the digital signal before outputting it. The buffer 190 may include a plurality of column memory blocks, e.g., static random access memories (SRAMs), provided for respective columns for temporary storage; and a sense amplifier sensing and amplifying the digital signal received from the ADC 140.

Figure 2:
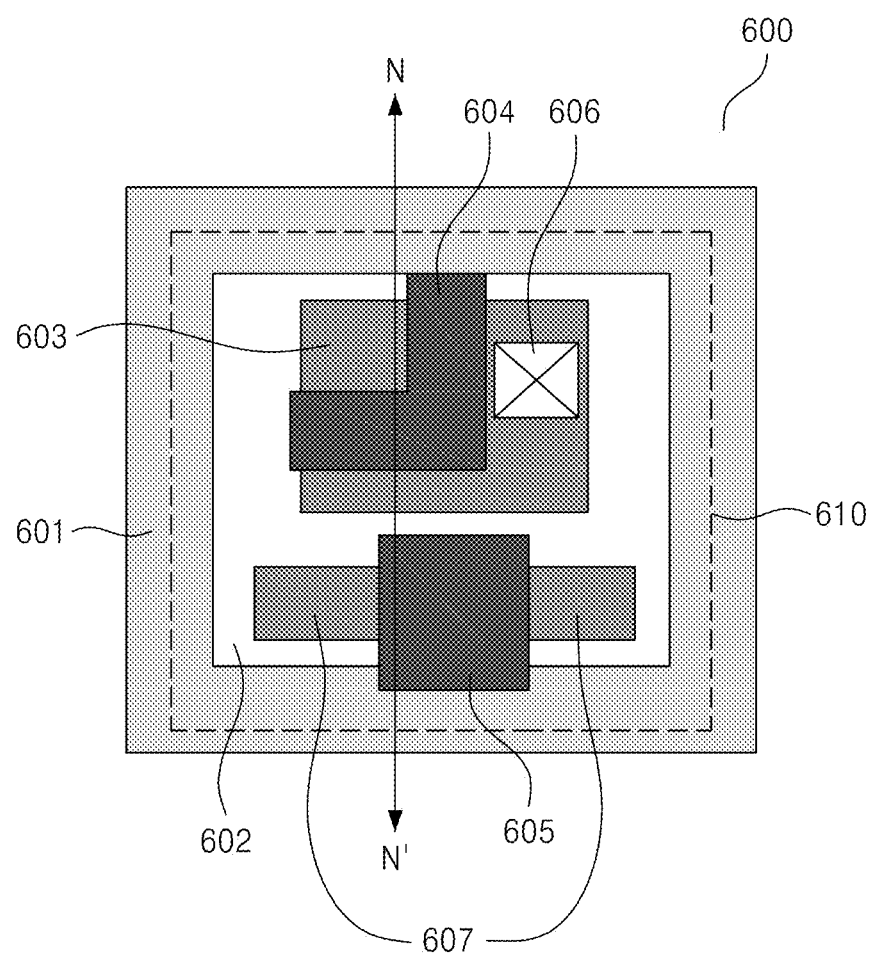
FIG. 2 is a block diagram of the layout of a unit pixel according to exemplary embodiments in accordance with principles of inventive concepts.

FIG. 2 is a block diagram of a layout 600 of a unit pixel 610 according to exemplary embodiments in accordance with principles of inventive concepts. Referring to FIG. 2, the layout 600 shows the disposition of elements included in the unit pixel 610. A plurality of unit pixels 610 may be arranged in a matrix form in the pixel array 110 illustrated in FIG. 1. The layout 600 may include a deep trench isolation (DTI) 601, a shallow trench isolation (STI) 602, a floating diffusion 603, a transfer transistor's gate 604, a supplemental transistor's gate 605, a ground 606, and a p-well region 607.

The DTI 601 is formed at the edge of the unit pixel 610 to be vertically deep in order to electrically isolate the unit pixel 610 from adjacent pixels (not shown). The DTI 601 is formed using a DTI process and may be filled with oxide or polysilicon, for example. The DTI 601 prevents electric crosstalk between the unit pixel 610 and adjacent pixels. Such crosstalk may occur when the unit pixel 610 exchanges carriers with adjacent pixels. Crosstalk could decrease signal-to-noise ratio and thereby degrade the performance of image sensor 100. Additionally, in accordance with principles of inventive concepts, a sidewall (608 in FIG. 3) of the DTI 601 is doped with a high-reflectance material, thereby preventing optical crosstalk (in which light incident on the unit pixel 610 is transmitted to the adjacent pixels) and a concomitant decrease in signal-to-noise ratio. The sidewall 608 of the DTI 601 may be formed of polysilicon doped with boron having a high reflectance, for example, but inventive concepts are not restricted to this example.

The STI 602 may be formed around the floating diffusion 603, the transfer transistor's gate 604, the supplemental transistor's gate 605, the ground 606, and the p-well region 607 inside the DTI 601. The STI 602 may be formed using an STI process in order to electrically isolate the regions 603 through 607 from one another. In an exemplary embodiment in accordance with principles of inventive concepts STI 602 is shallower than the DTI 601.

The floating diffusion 603 may be formed adjacent to the transfer transistor's gate 604. The floating diffusion 603 may be separated from the DTI 601 by the STI 602 or may be formed in the immediate vicinity of the DTI 601. Photocharge generated by a photodiode is transferred to the floating diffusion node 603 by the transfer transistor and is accumulated there. The photodiode will be described in greater detail in the discussion related to the following Figures.

The transfer transistor's gate 604 may be formed around the floating diffusion 603. The transfer transistor may transfer the photocharge generated by the photodiode to the floating diffusion 603 in response to a transfer control signal received at the transfer transistor's gate 604.

The supplemental transistor's gate 605 may be formed so that the STI 602 isolates it from the transfer transistor's gate 604, for example. The supplemental transistor may be a reset transistor, a drive transistor, or a select transistor. The ground 606 may supply a ground voltage necessary for the operation of the unit pixel 610. For example, the ground 606 may supply the ground voltage to an end of the photodiode.

The p-well region 607 may be formed around the supplemental transistor's gate 605. An n++-doped region (not shown) may be formed in the p-well region 607 and may function as a source or a drain of the supplemental transistor. That is, in an exemplary embodiment in accordance with principles of inventive concepts, the p-well region 607 may electrically isolate the n++-doped region.

Accordingly, in accordance with principles of inventive concepts, the unit pixel 610 includes only one transistor in addition to the transfer transistor. With only one transistor in addition to the transfer transistor, the area of the unit pixel 610 may be minimized. By minimizing the area of the pixel, the resolution of the pixel array 110 may be increased. Additionally, by minimizing the number of transistors in the pixel, power consumption may be minimized.

Figure 3:
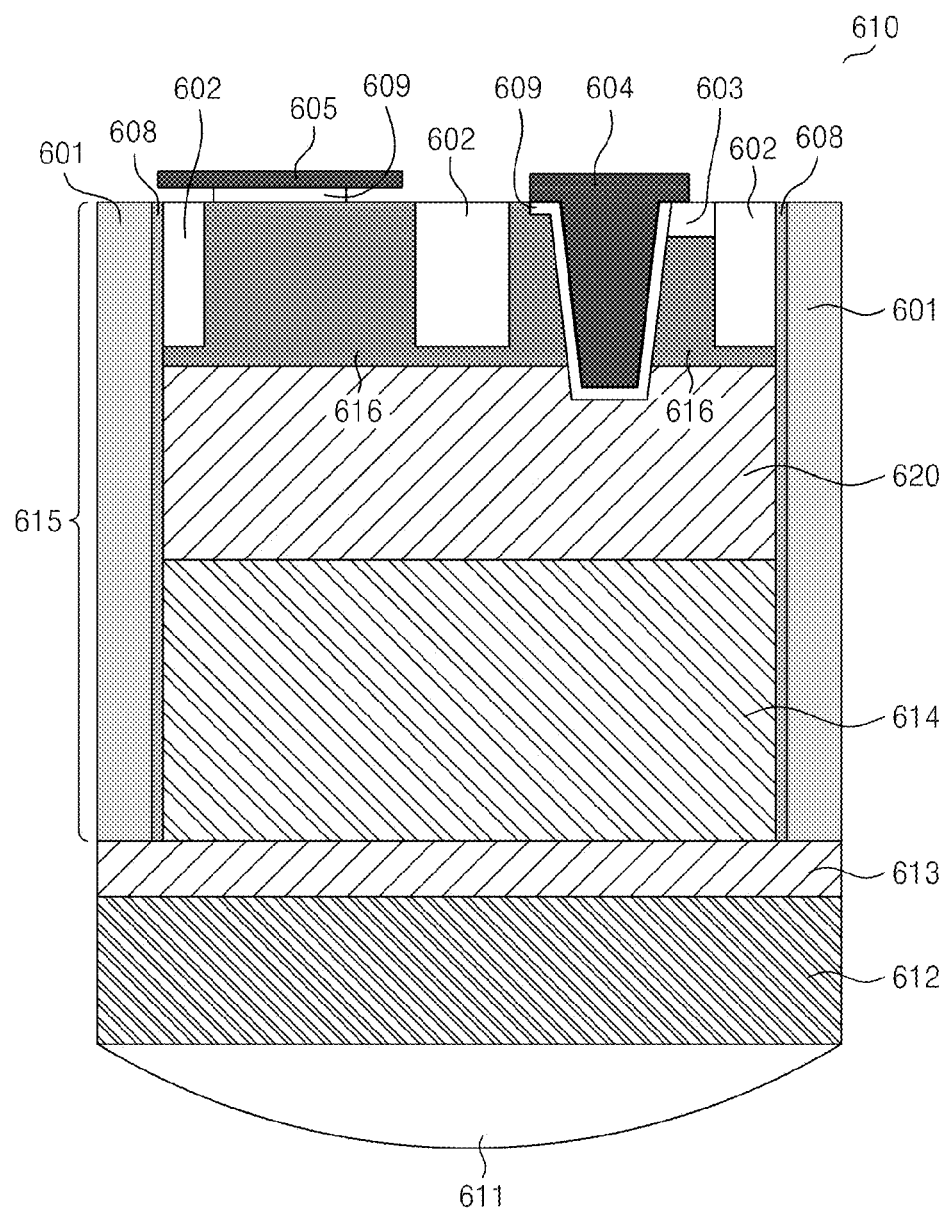
FIG. 3 is a block diagram of the vertical cross-section of the unit pixel illustrated in FIG. 2.

FIG. 3 is a block diagram of a vertical cross-section of the exemplary embodiment of a unit pixel 610 in accordance with principles of inventive concepts, as illustrated in FIG. 2. Referring to FIGS. 2 and 3, FIG. 3 illustrates a cross-section of the unit pixel 610, taken along the line N-N' of FIG. 2. The unit pixel 610 may be formed by stacking the micro lens 611, a color filter 612, an anti-reflection layer 613, and a semiconductor substrate 615. The semiconductor substrate 615 may include the DTI 601, an epitaxial layer 614, a photodiode 620, a well layer 616, the STI 602, the supplemental transistor's gate 605, the transfer transistor's gate 604, and the floating diffusion 603. It is assumed that light reflected from an object is incident on the micro lens 611 from the bottom in FIG. 3 and that transistors included in this exemplary embodiment in accordance with principles of inventive concepts of the unit pixel 610 are n-type metal oxide semiconductor (NMOS) transistors.

The micro lens 611 may be formed at the bottom of the unit pixel 610 to entirely cover it. The micro lens 611 may be used, for example, to increase light gathering power, so that the quality of images is increased.

The color filter 612 may be formed on the micro lens 611 to selectively transmit light of a particular wavelength (e.g., red, green, blue, magenta, yellow, or cyan), or range of wavelengths. A planarization layer (not shown) called an overcoating layer may be formed below the color filter 612. The color filter 612 may be omitted, for example, when the unit pixel 610 is used to form a depth sensor.

The anti-reflection layer 613 may be fainted on the color filter 612. The anti-reflection layer 613 may prevent the reflection of incident light coming in through the micro lens 611 and the color filter 612. That is, the anti-reflection layer 613 transmits the incident light efficiently and reduces reflection from subsequent layers (e.g., epitaxial layer 614), thereby increasing the performance (e.g., light receiving efficiency and photo sensitivity) of the image sensor 100.

As described above, the DTI 601 prevents electric crosstalk in relation with the adjacent pixels. The sidewall 608 of the DTI 601 may be doped with a high-reflectance material that reduces optical crosstalk with adjacent pixels. The epitaxial layer 614 may be a p-type epitaxial layer formed on a p-type bulk silicon substrate, for example.

The photodiode 620 may be formed using ion-implantation to be an n-type region in the epitaxial layer 614. The photodiode 620 is a photoelectric conversion element that may generate photocharge varying with the intensity of incident light. The photodiode 620 may be replaced by a photo transistor, a PIN. photodiode, or a combination thereof in other exemplary embodiments in accordance with principles of inventive concepts. The photodiode 620 may be formed in a structure in which a plurality of doped regions are staked, for example, and, in such embodiments, an upper doped region may be formed by implantation of n+-type ions and a lower doped region may be formed by implantation of n--type ions. The photodiode 620 may be formed in the entire area of the unit pixel 610 except for the DTI 601 in order to acquire a high fill-factor. The fill-factor may be defined by a ratio of a light receiving area to the area of a unit pixel. The higher the fill-factor, the higher the light receiving efficiency of an image sensor.

The well layer 616 may be formed on the photodiode 620 to electrically isolate the photodiode 620 from transistors formed above the photodiode 620. The n++-doped region near the supplemental transistor's gate 605 may operate as the source and drain of the supplemental transistor. Multi-layer conductive lines (not shown) may be formed on the semiconductor substrate 615. The multi-layer conductive lines (not shown) may be formed by patterning a conductive material including a metal such as copper or aluminum. The STI 602 may be formed to electrically isolate adjacent elements, as described above with reference to FIG. 2.

The supplemental transistor's gate 605 and the transfer transistor's gate 604 may be formed on a gate insulating layer 609. The gate insulating layer 609 may be formed of $SiO_2$, SiON, SiN, $Al_2O_3$, $Si_3N_4$, $Ge_xO_yN_z$, $Ge_xSi_yO_z$, or a high dielectric material. The high dielectric material may be formed by performing atomic layer deposition of $HfO_2$, $ZrO_2$, $Al_2O_3$, $Ta_2O_5$, hafnium silicate, zirconium silicate, or a combination thereof, for example. In exemplary embodiments in accordance with principles of inventive concepts, the transfer transistor's gate 604 may be formed using an etching process in response to the formation of the photodiode 620 in the middle of the semiconductor substrate 615. The transfer transistor's gate 604 may be formed to be deeper or shallower than the top of the photodiode 620.

The floating diffusion 603 may be formed adjacent to the transfer transistor's gate 604. The epitaxial layer 614 may be formed between the photodiode 620 and the transfer transistor's gate 604 so that the transfer transistor's gate 604 is electrically isolated from the photodiode 620.

Figure 4:
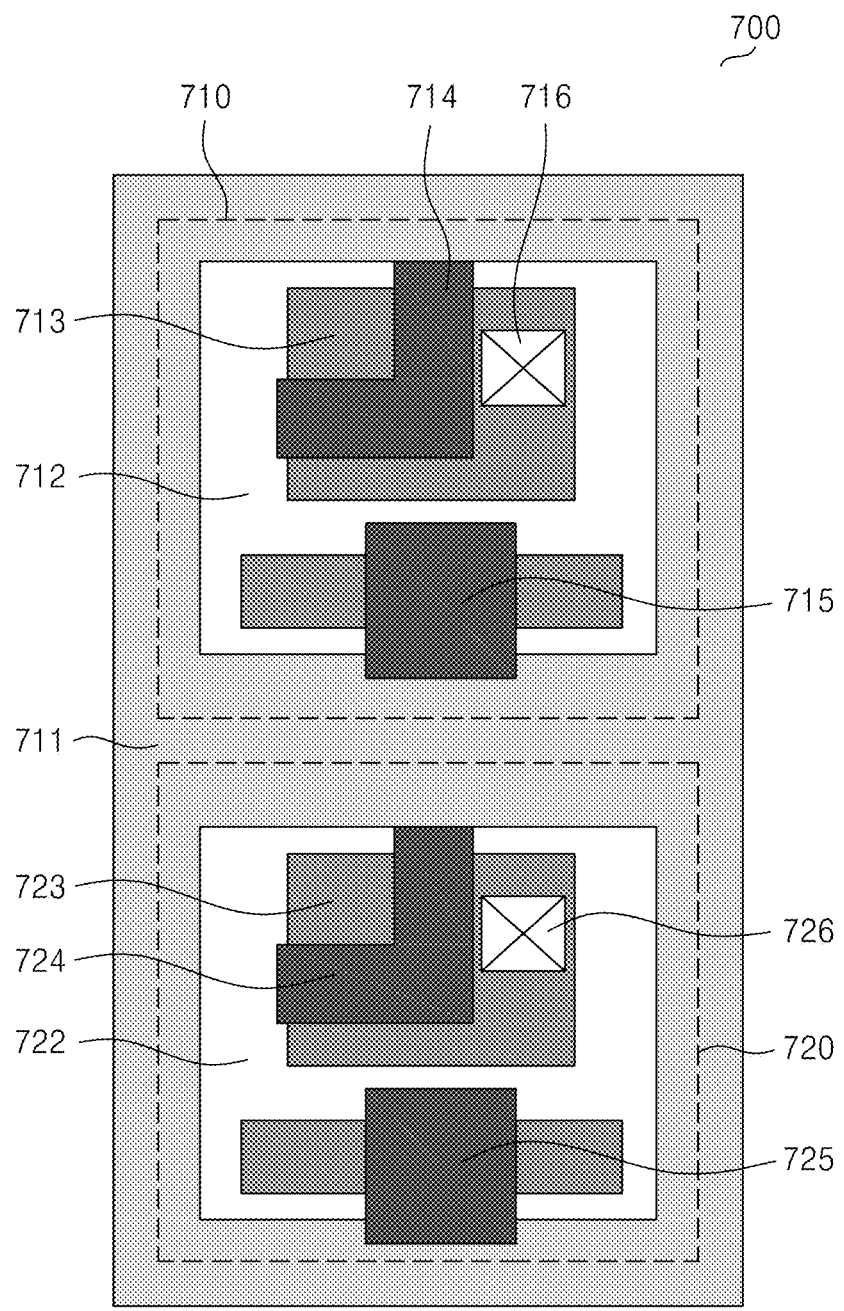
FIG. 4 is a block diagram of the layout of a plurality of unit pixels according to exemplary embodiments in accordance with principles of inventive concepts.

FIG. 4 is a block diagram of a layout 700 of a plurality of unit pixels 710 and 720 according to exemplary embodiments in accordance with principles of inventive concepts. Referring to FIGS. 2 through 4, the first pixel 710 and the second pixel 720 are adjacent to one another and electrically isolated from each other by a DTI 711. Internal elements of the first pixel 710 are electrically isolated from each other by an STI 712. Internal elements of the second pixel 720 are electrically isolated from each other by an STI 722. The first pixel 710 includes a floating diffusion 713, a ground 716, and a first transfer transistor 714. The second pixel 720 includes a floating diffusion 723, a ground 726, and a second transfer transistor 724. The floating diffusions 713 and 723 of the respective first and second pixels 710 and 720 may be connected with each other through a conductive line (not shown), thereby allowing the pixels to operate as a single node.

The first and second pixels 710 and 720 may include a first supplemental transistor 715 and a second supplemental transistor 725, respectively. The first supplemental transistor 715 may function as a reset transistor (RX in FIG. 5) and the second supplemental transistor 725 may function as a drive transistor (DX in FIG. 5).

In other words, the first and second pixels 710 and 720 may respectively include photodiodes 717 and 727, the grounds 718 and 728, and the transfer transistors 714 and 724 and may share a floating diffusion (FD in FIG. 5), the reset transistor, and the drive transistor with each other. Accordingly, each of the first and second pixels 710 and 720 includes only two transistors, so that the area of the first and second pixels 710 and 720 is minimized.

Although the first and second pixels 710 and 720 are arranged along a vertical line in the exemplary embodiment represented in FIG. 4, they may be otherwise arranged, such as, along a horizontal line. A plurality of first and second pixels 710 and 720 may be arranged in a matrix form to construct the pixel array 110 described in the discussion related to FIG. 1.

Figure 5:
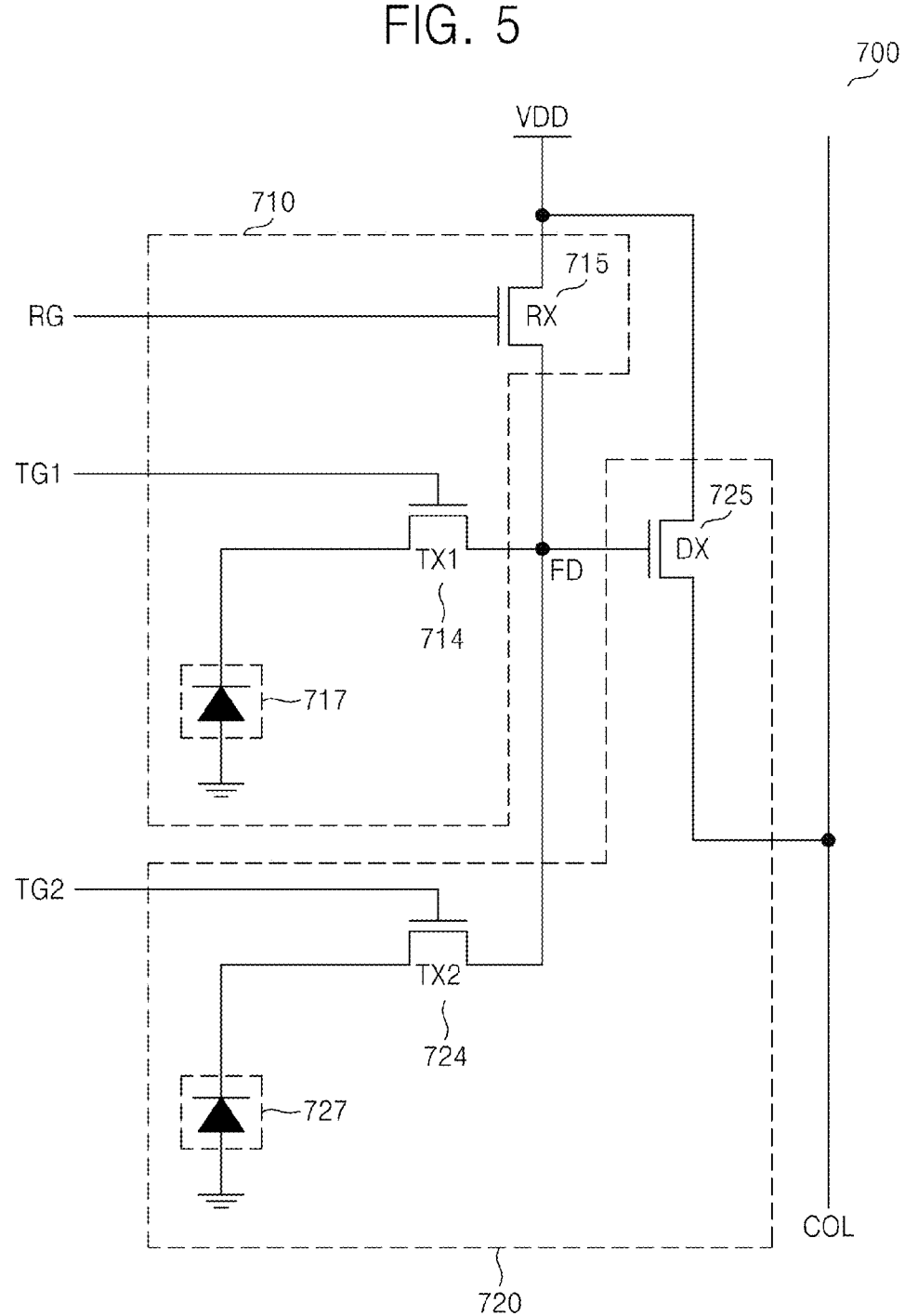
FIG. 5 is a circuit diagram corresponding to the layout of the unit pixels illustrated in FIG. 4.

FIG. 5 is a circuit diagram corresponding to the layout 700 of the unit pixels 710 and 720 described in the discussion related to FIG. 4. Referring to FIGS. 4 and 5, the first pixel 710 includes the first photodiode 717, the first transfer transistor 714, and the first supplemental transistor 715. The second pixel 720 includes the second photodiode 727, the second transfer transistor 724, and the second supplemental transistor 725. Elements respectively included in different pixels may be connected to each other by a conductive line.

The first photodiode 717 and the second photodiode 727 may receive light incident on the first and second pixels 710 and 720, respectively, and may generate first photocharge and second photocharge, respectively, based on the light received. The first and second transfer transistors 714 and 724 may transfer the first photocharge and the second photocharge, respectively, to the floating diffusion FD in response to a first transfer control signal TG1 and a second transfer control signal TG2, respectively. The timing of the first and second transfer control signals TG1 and TG2 may be controlled to sense the first photocharge generated in the first pixel 710 and the second photocharge generated in the second pixel 720. That is, in an exemplary embodiment in accordance with principles of inventive concepts, after the first photocharge is transferred to the floating diffusion FD in response to the first transfer control signal TG1 and the floating diffusion FD is reset, the second transfer control signal TG2 may be activated (e.g., to a high level). When a transfer control signal is activated, the corresponding transfer control transistor may be said to be "selected" and the transfer control signals may also be referred to herein as selection signals, for example.

The pixel operation of a CMOS image sensor in accordance with principles of inventive concepts will be described in the context of an example of selecting pixels of n-th line (n-th row).

In this exemplary embodiment, time period (t<t1) is the non-selection state. In the non-selection state, since vertical selection pulse is in Low level (0 V) and reset transistor RX is in off state, the potential of floating diffusion 603 is 0 V.

At time t1, the vertical selection pulse changes from Low to High (3.3V, for example), and at the same time, in response to the occurrence of reset pulse, the reset transistor RX goes on and the potential of floating diffusion 603 of the n-th line is reset from 0 V to 3.3V. As a result, since an drive transistor DX (e.g., transistor 725) is turned on, pixels of the n-th line go into selection state (t1<t<t2).

Upon the extinction of the reset pulse at time t2, the reset floating diffusion 603 is read. Consequently, an offset level (hereinafter, called a noise level) different for each different pixel is read into the vertical signal line by an drive transistor DX and output to the vertical signal line output circuit 27 (t2<t<t3). The read-out noise level is held (sample held) within a vertical signal line output circuit.

Upon the occurrence of transfer pulse at time t3, the transfer transistor (e.g., transistor 714), because a potential below the gate thereof is deepened by the transfer pulse applied to the gate, transfers signal charge stored in the photodiode 717 to the floating diffusion 603 (t3<t<t4). The transfer of signal charge causes the potential of the floating diffusion 603 to change according to the quantity of stored charge.

Upon the extinction of the transfer pulse at time t4, a potential in accordance with the signal charge of the floating diffusion 603 is read into the vertical signal line by an drive transistor DX and output to a vertical signal line output circuit (t4<t<t5). In accordance with principles of inventive concepts, the read-out signal level may be held (sample held) within the vertical signal line output circuit.

Upon entry to a horizontal valid period, signals read from pixels into the vertical signal line output circuit for each column are sequentially output to the horizontal signal line output circuit through a horizontal signal line. At this time, in an exemplary embodiment in accordance with principles of inventive concepts, in these output circuits, by subtracting a noise level from the signal level of unit pixel, a fixed pattern noise due to the dispersion of characteristics of unit pixel is suppressed and a fixed pattern noise due to the dispersion of characteristics of the vertical signal line output circuit is suppressed.

At time t6, the vertical selection pulse changes from High to Low, and, as a result, pixels on the n-th line go into non-selection state, and at the same time, pixels on the next (n+1)-th line go into selection state, and the above operation is repeated on the (n+1)-th line. In an exemplary embodiment in accordance with principles of inventive concepts, a description will be made of pixels on non-selected lines. By driving the vertical selection pulse Low (0 V), a pixel can be put in non-selection state. This is because since a depression type transistor is used as the reset transistor RX, when the vertical selection pulse is 0 V, the floating diffusion 603 is always 0 V, and thereby an drive transistor DX is always in cut-off state.

In exemplary embodiments in accordance with principles of inventive concepts, the first supplemental transistor 715 may function as the reset transistor RX and may be implemented by an n-channel depression type transistor. The first supplemental transistor 715 may reset the floating diffusion FD to a VDD voltage, for example. Additionally, the first supplemental transistor 715 may maintain the floating diffusion FD at a low voltage level (e.g., 0 V) when neither of the first and second pixels 710 and 720 is selected, so that the second supplemental transistor 725, which, in exemplary embodiments in accordance with principles of inventive concepts is configured as the drive transistor DX, is cut off. The operation of the first supplemental transistor 715 may be controlled by a reset control signal RG output from the row driver 120 and a reset switch (not shown) provided between the first supplemental transistor 715 and a VDD voltage node, for example.

The second supplemental transistor 725 may function as the drive transistor DX and may be implemented by an n-channel enhancement type transistor, for example. The second supplemental transistor 725 may output a voltage signal corresponding to the potential of the floating diffusion FD to a column line COL through its source. That is, the second supplemental transistor 725 may output a reset signal according to a potential of the floating diffusion FD after the reset of the floating diffusion FD or may output an image signal according to a potential of the floating diffusion FD after the first or second photocharge is accumulated at the floating diffusion FD. In exemplary embodiments in accordance with principles of inventive concepts, the CDS block 130 described in the discussion related to FIG. 1 may perform CDS on voltage signals (i.e., a reset signal and an image signal) output from each row.

Figure 6A:
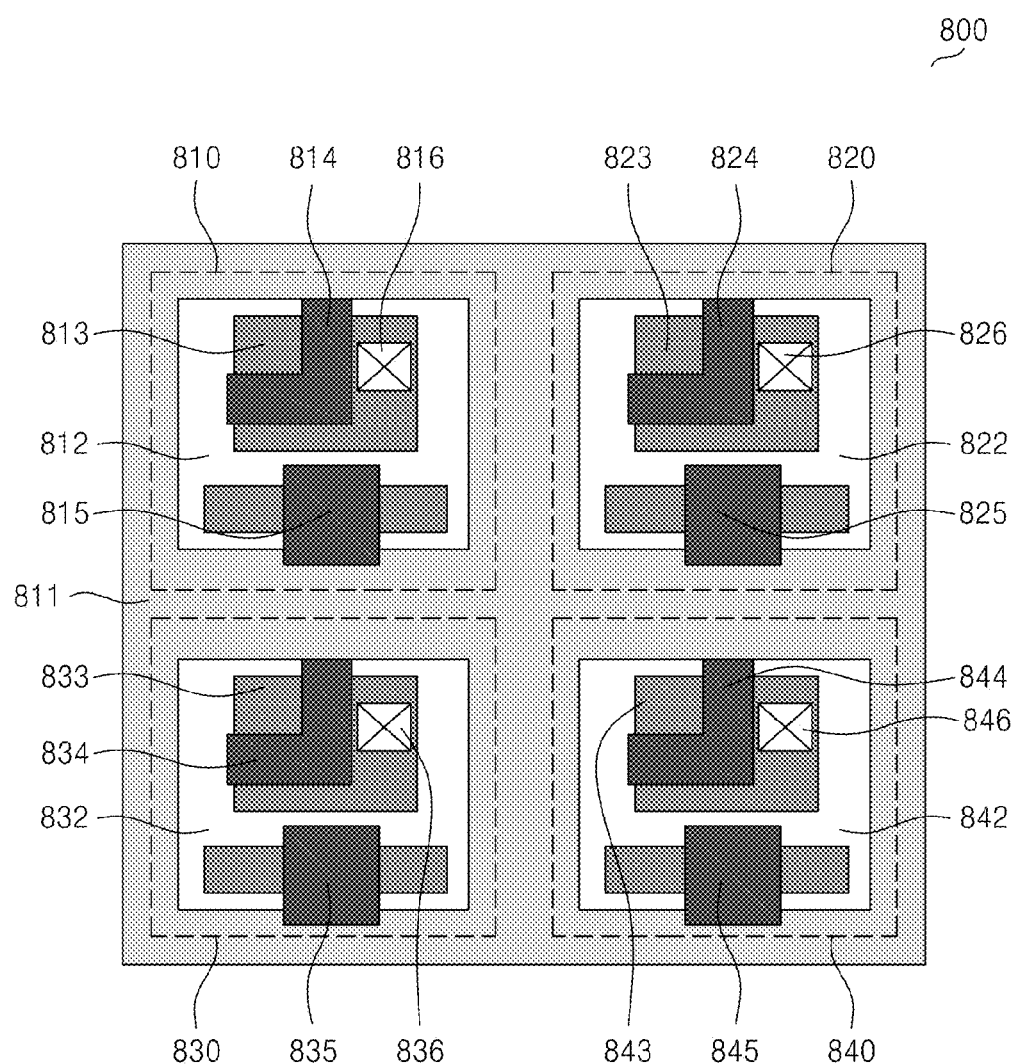
FIGS. 6A and 6B are block diagrams of the layouts of exemplary embodiments of a plurality of unit pixels in accordance with principles of inventive concepts.
Figure 6B:
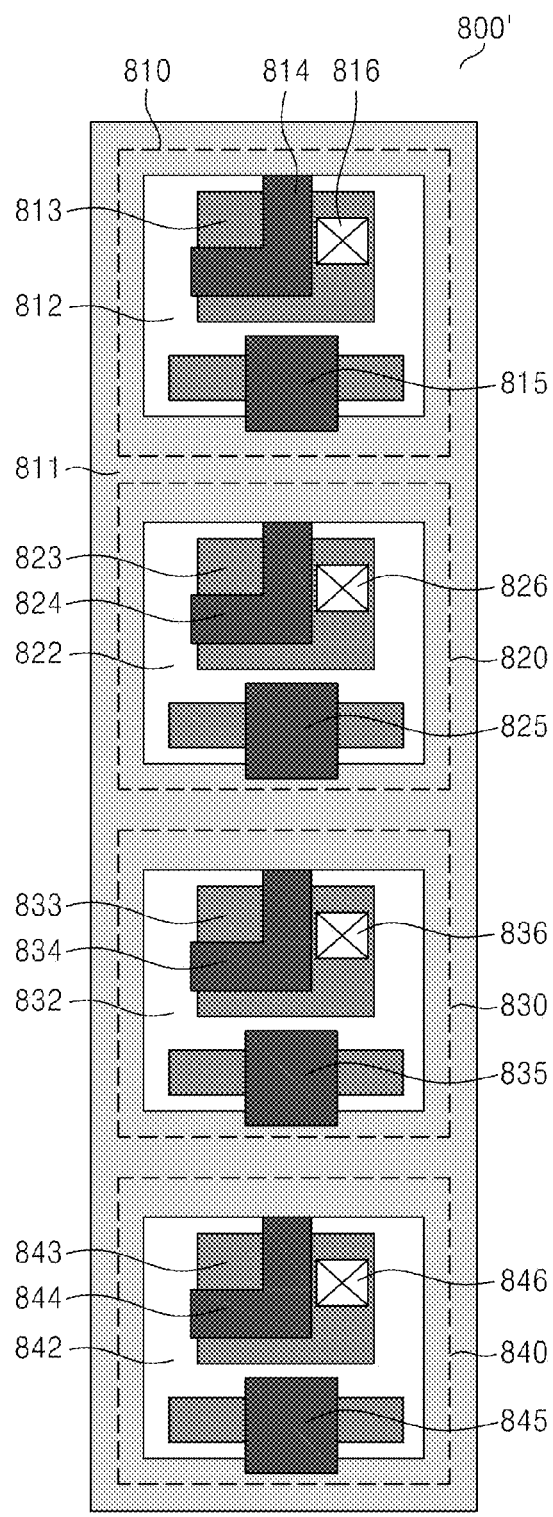

FIGS. 6A and 6B are block diagrams of layouts 800 and 800' of a plurality of unit pixels 810, 820, 830, and 840 of exemplary embodiments in accordance with principles of inventive concepts. Referring to FIGS. 2, 3, and 6A, the first through fourth pixels 810, 820, 830, and 840 are arranged in a matrix form. The first through fourth pixels 810, 820, 830, and 840 are electrically isolated from one another by a DTI 811. Internal elements of each of the first through fourth pixels 810, 820, 830, and 840 are electrically isolated from each other by an STI 812, 822, 832, or 842. The first through fourth pixels 810, 820, 830, and 840 respectively include floating diffusions 813, 823, 833, and 843, grounds 816, 826, 836, and 846, and first through fourth transfer transistors 814, 824, 834, and 844. The floating diffusions 813, 823, 833, and 843 of the respective first through fourth pixels 810, 820, 830, and 840 may be connected to one another by a conductive line (not shown), thereby operating as a single node (as described in the discussion related to FIG. 5).

The first through fourth pixels 810, 820, 830, and 840 may include first through fourth supplemental transistors 815, 825, 835, and 845, respectively. In exemplary embodiments in accordance with principles of inventive concepts, the first supplemental transistor 815 may function as a reset transistor (e.g., RX in FIG. 7); the second supplemental transistor 825 may function as a drive transistor (e.g., DX in FIG. 7); the third supplemental transistor 835 may function as a select transistor (e.g., SX in FIG. 7); and the fourth supplemental transistor 845 may be a dummy transistor whose gate, source and drain are connected to the ground 846 and thus not to contribute to circuit construction.

That is, in exemplary embodiments in accordance with principles of inventive concepts, such as illustrated in FIG. 6B, the first through fourth pixels 810, 820, 830, and 840 may respectively include photodiodes 817, 827, 837, and 847, the grounds 816, 826, 836, and 846, and the transfer transistors 814, 824, 834, and 844 and may share the floating diffusion FD, the reset transistor RX, the drive transistor DX, and the select transistor SX with one another. Accordingly, each of the first through fourth pixels 810, 820, 830, and 840 includes only two transistors, so that the area of the first through fourth pixels 810, 820, 830, and 840 is minimized (thereby allowing for greater imaging resolution).

The positions of the first through fourth pixels 810, 820, 830, and 840 respectively including the first through fourth supplemental transistors 815, 825, 835, and 845 may be changed within the matrix form. Referring to FIG. 6B, the first through fourth pixels 810, 820, 830, and 840 may be arranged in linear form, for example, rather than the matrix form described in the discussion related to FIG. 6A.

The disposition of the grounds 816, 826, 836, and 846, the floating diffusions 813, 823, 833, and 843, the transfer transistors 814, 824, 834, and 844, the supplemental transistors 815, 825, 835, and 845, and the STIs 812, 822, 832, and 842 is not restricted to the embodiments described in the discussion related to FIGS. 6A and 6B and may be changed in various ways in accordance with principles of inventive concepts.

Figure 7:
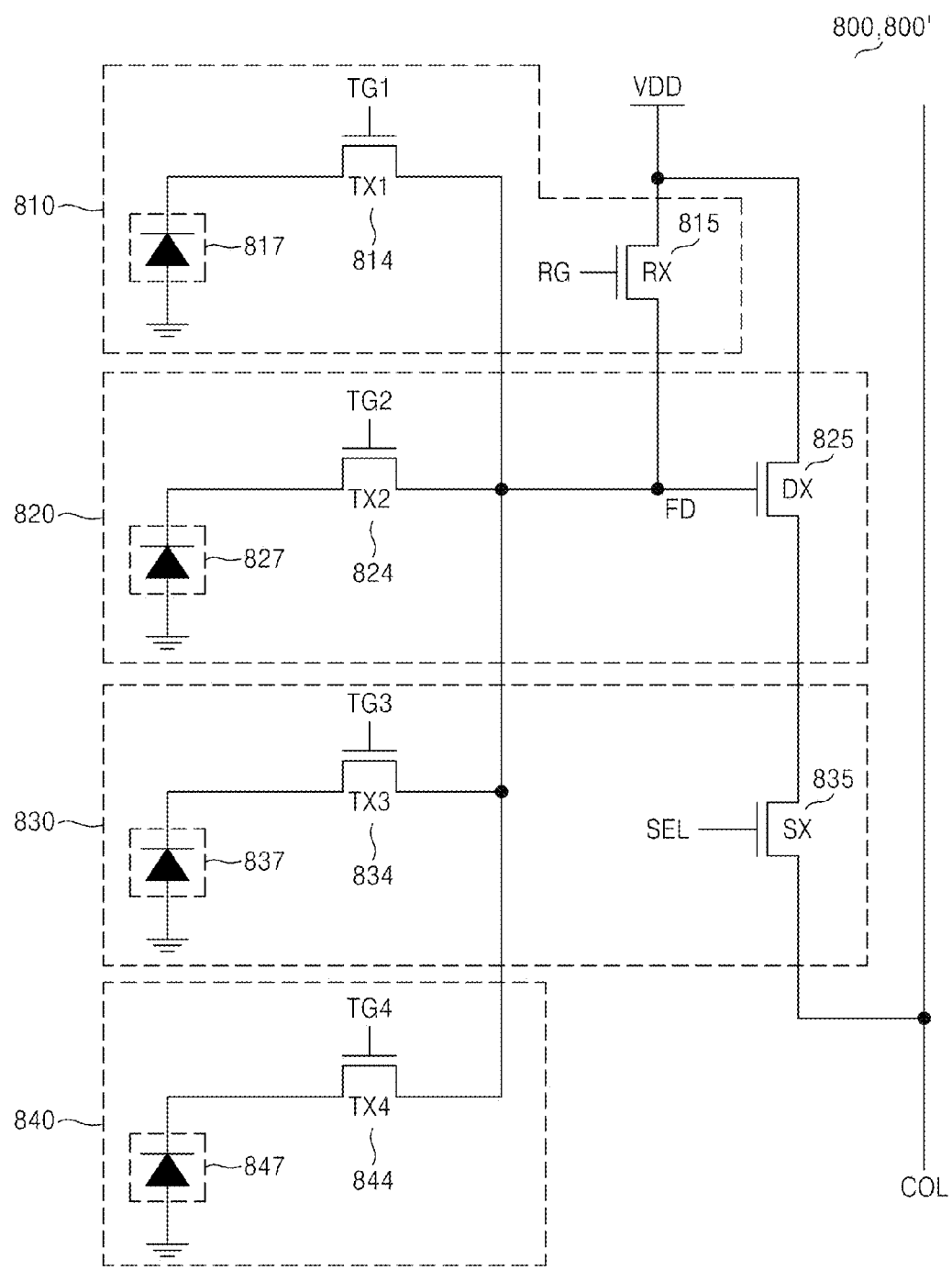
FIG. 7 is a circuit diagram corresponding to the layouts of the unit pixels illustrated in FIGS. 6A and 6B.

FIG. 7 is a circuit diagram corresponding to the layouts 800 and 800' of the unit pixels 810, 820, 830, and 840 described in the discussion related to FIGS. 6A and 6B. Referring to FIGS. 6A through 7, the first through fourth pixels 810, 820, 830, and 840 respectively include the first through fourth photodiodes 817, 827, 837, and 847; the first through fourth transfer transistors 814, 824, 834, and 844; and the first through fourth supplemental transistors 815, 825, 835, and 845. Similar to previously described embodiments, elements respectively included in different pixels may be connected to each other by a conductive line.

In exemplary embodiments in accordance with principles of inventive concepts, the first through fourth photodiodes 817, 827, 837, and 847 may receive light incident on the first through fourth pixels 810, 820, 830, and 840, respectively, and may generate first through fourth photocharges, respectively, based on the light received. The first through fourth transfer transistors 814, 824, 834, and 844 may transfer the first through fourth photocharges, respectively, to the floating diffusion FD in response to first through fourth transfer control signals TG1, TG2, TG3, and TG4, respectively. The timing of the first through fourth transfer control signals TG1, TG2, TG3, and TG4 may be controlled to respectively sense the first through fourth photocharges respectively generated in the first through fourth pixels 810, 820, 830, and 840. In other words, the timing of the first through fourth transfer control signals TG1, TG2, TG3, and TG4 may be controlled so that the sensing of each of the first through fourth photocharges respectively generated in the first through fourth pixels 810, 820, 830, and 840 and the resetting of the floating diffusion FD are sequentially performed.

The first supplemental transistor 815 may function as the reset transistor RX and may be implemented by an n-channel enhancement type transistor, for example. The first supplemental transistor 815 may reset the floating diffusion FD to a VDD voltage according to a reset control signal RG output from the row driver 120.

The second supplemental transistor 825 may function as the drive transistor DX and may be implemented by an n-channel enhancement type transistor, for example. The second supplemental transistor 825 may output a voltage corresponding to a potential of the floating diffusion FD to a drain of the select transistor SX.

The third supplemental transistor 835 may function as the select transistor SX and may be implemented by an n-channel enhancement type transistor, for example. The third supplemental transistor 835 may output a voltage received from the second supplemental transistor 825 to a column line COL in response to a select control signal SEL. That is, the third supplemental transistor 835 may output a reset signal according to a potential of the floating diffusion FD after the reset of the floating diffusion FD or may output an image signal according to a potential of the floating diffusion FD after one of the first through fourth photocharges is accumulated at the floating diffusion FD. The CDS block 130 described in the discussion related to FIG. 1 may perform CDS on voltage signals (i.e., a reset signal and an image signal) output from each row.

In an exemplary embodiment in accordance with principles of inventive concepts, the gate, source and drain of the fourth supplemental transistor 845 are connected to the ground 846 and are thus not illustrated in FIG. 7.

Figure 8A:
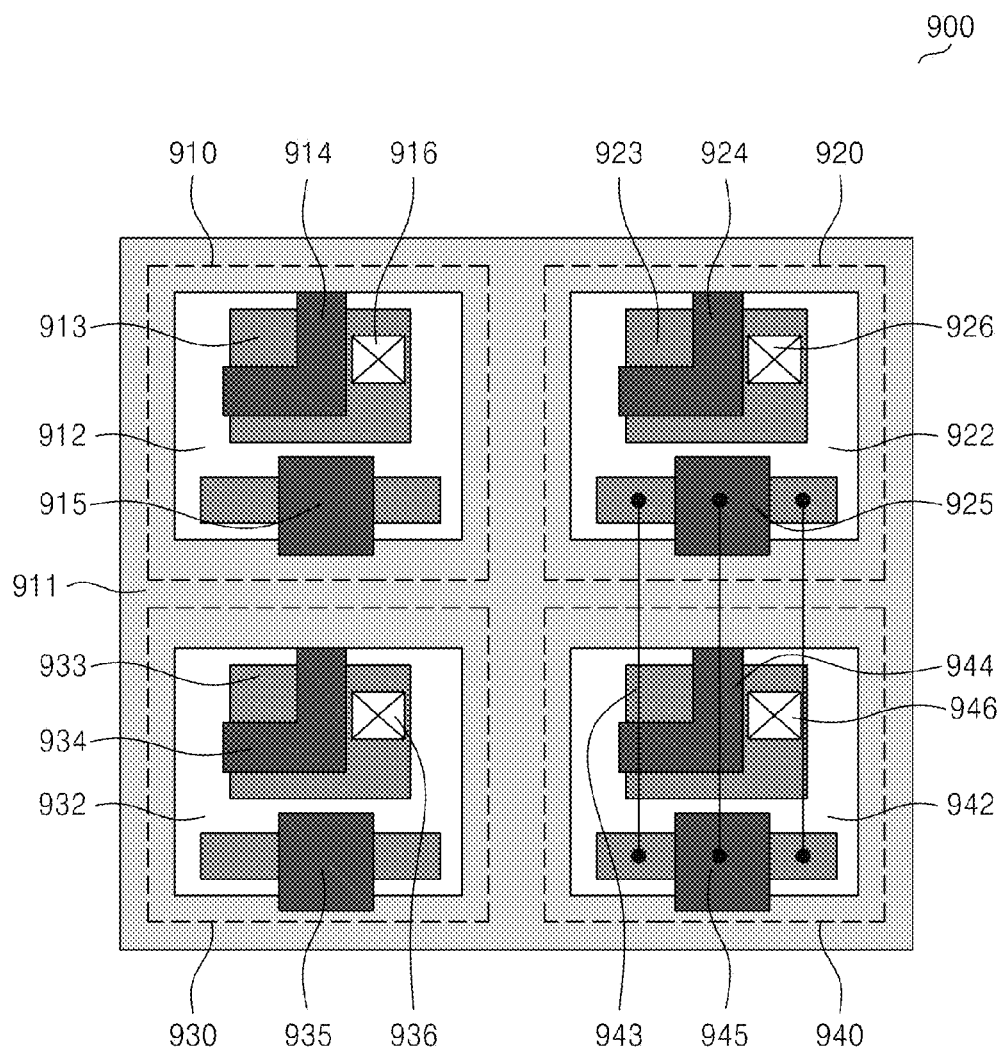
FIGS. 8A and 8B are block diagrams of the layouts of exemplary embodiments of a plurality of unit pixels in accordance with principles of inventive concepts.
Figure 8B:
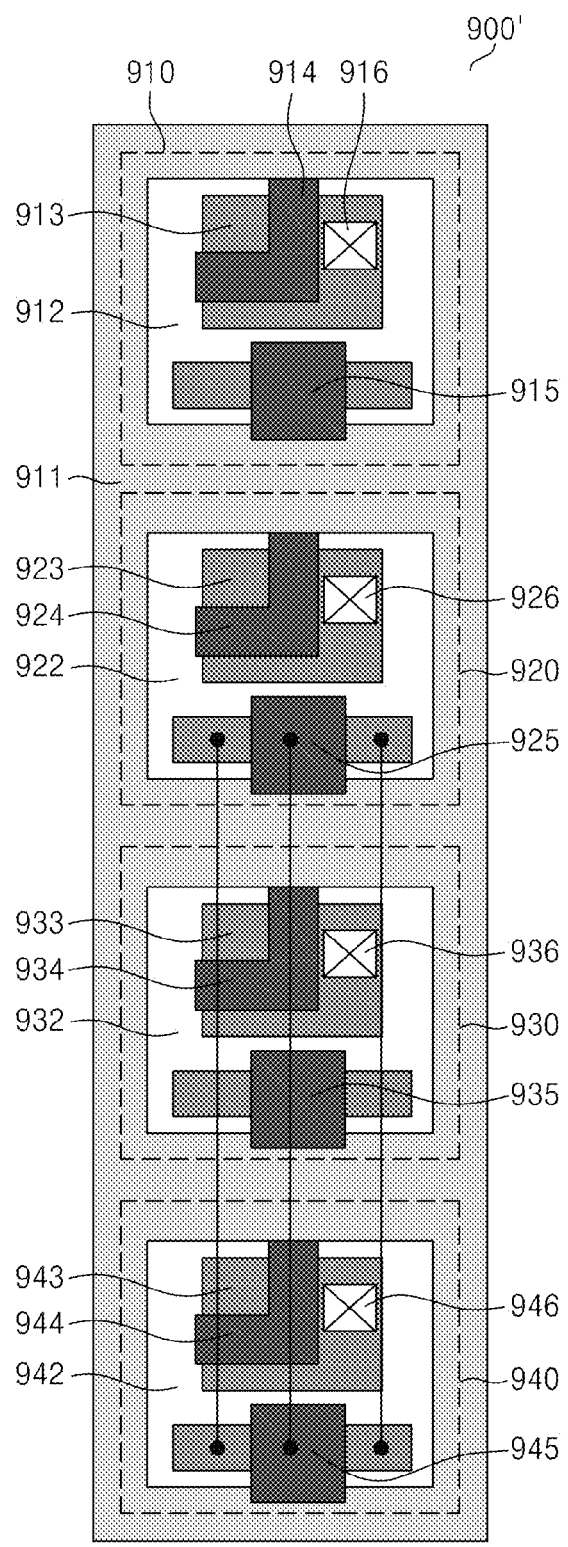

FIGS. 8A and 8B are block diagrams of layouts 900 and 900' of exemplary embodiments of a plurality of unit pixels 910, 920, 930, and 940 in accordance with principles of the inventive concepts. The layouts 900 and 900' illustrated in FIGS. 8A and 8B are similar to the layouts 800 and 800' illustrated in FIGS. 6A and 6B, and therefore, differences therebetween will be the focus of description.

The first through fourth pixels 910, 920, 930, and 940 may respectively include first through fourth supplemental transistors 915, 925, 935, and 945. The second supplemental transistor 925 of the second pixel 920 may be a first drive transistor (e.g., DX1 in FIG. 9) and the fourth supplemental transistor 945 of the fourth pixel 940 may be a second drive transistor (e.g., DX2 in FIG. 9). A gate, source and drain of the second supplemental transistor 925 may be respectively connected by a conductive line to those of the fourth supplemental transistor 945, for example.

When the second supplemental transistor 925 and the fourth supplemental transistor 945 are connected to each other as described above, the width of a drive transistor (e.g., DX' in FIG. 9) may be doubled. When charges move between a source and a drain of the drive transistor DX' according to a potential of a floating diffusion (FD in FIG. 9), flicker noise (or 1/f noise) may occur due to a surface trap effect. Because flicker noise degrades image quality, it should be reduced, and, by doubling the width of the drive transistor DX', flicker noise is reduced. Referring to FIG. 8B, in accordance with principles of inventive concepts, the first through fourth pixels 910, 920, 930, and 940 may be arranged in linear form, rather than the matrix form described in the discussion related to FIG. 8A.

Figure 9:
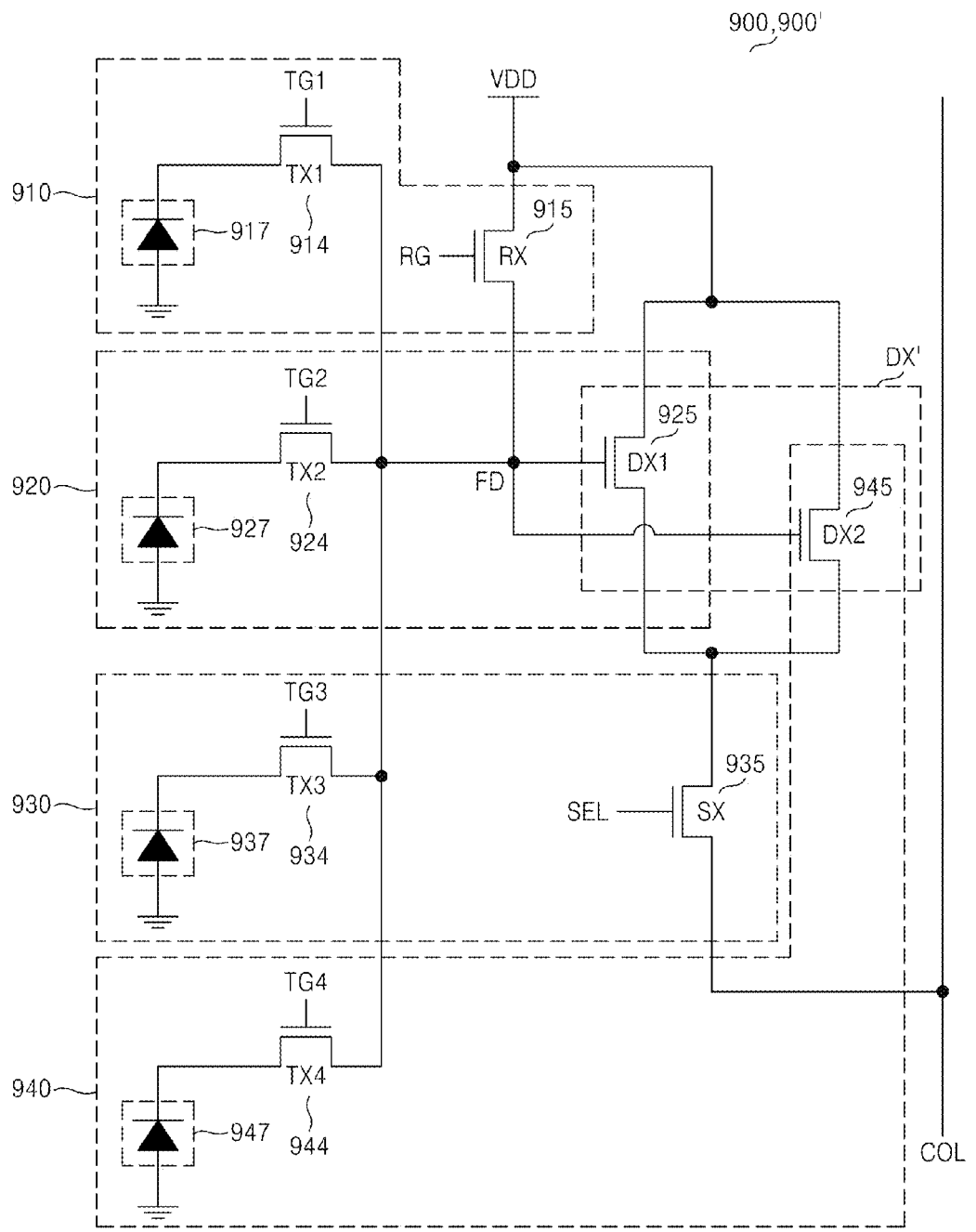
FIG. 9 is a circuit diagram corresponding to the layouts of the unit pixels illustrated in FIGS. 8A and 8B.

FIG. 9 is a circuit diagram corresponding to the layouts 900 and 900' of the unit pixels 910, 920, 930, and 940 illustrated in FIGS. 8A and 8B. The circuit diagram corresponding to the layouts 900 and 900' illustrated in FIG. 9 is similar to that illustrated in FIG. 7, and therefore, differences therebetween will be the focus of description.

In accordance with principles of inventive concepts, the second supplemental transistor 925 of the second pixel 920 and the fourth supplemental transistor 945 of the fourth pixel 940 may operate as the first drive transistor DX1 and the second drive transistor DX2, respectively. The gate, drain and source of the second supplemental transistor 925 may be connected to the gate, drain and source, respectively, of the fourth supplemental transistor 945. That is, in such exemplary embodiments, the gates of the respective second and fourth supplemental transistors 925 and 945 may be connected to the floating diffusion FD, the drains thereof may be connected to a VDD voltage node, and the sources thereof may be connected to a drain of the third supplemental transistor 935. The second and fourth supplemental transistors 925 and 945 may operate together, in parallel, as drive transistor DX'. Accordingly, the drive transistor DX' illustrated in FIG. 9 may be double the width of the drive transistor DX illustrated in FIG. 7. As a result, flicker noise occurring when the drive transistor DX' outputs a voltage corresponding to the potential of the floating diffusion FD to the drain source of the select transistor SX may be reduced relative to an embodiment employing a drive transistor of lesser width.

Figure 10:
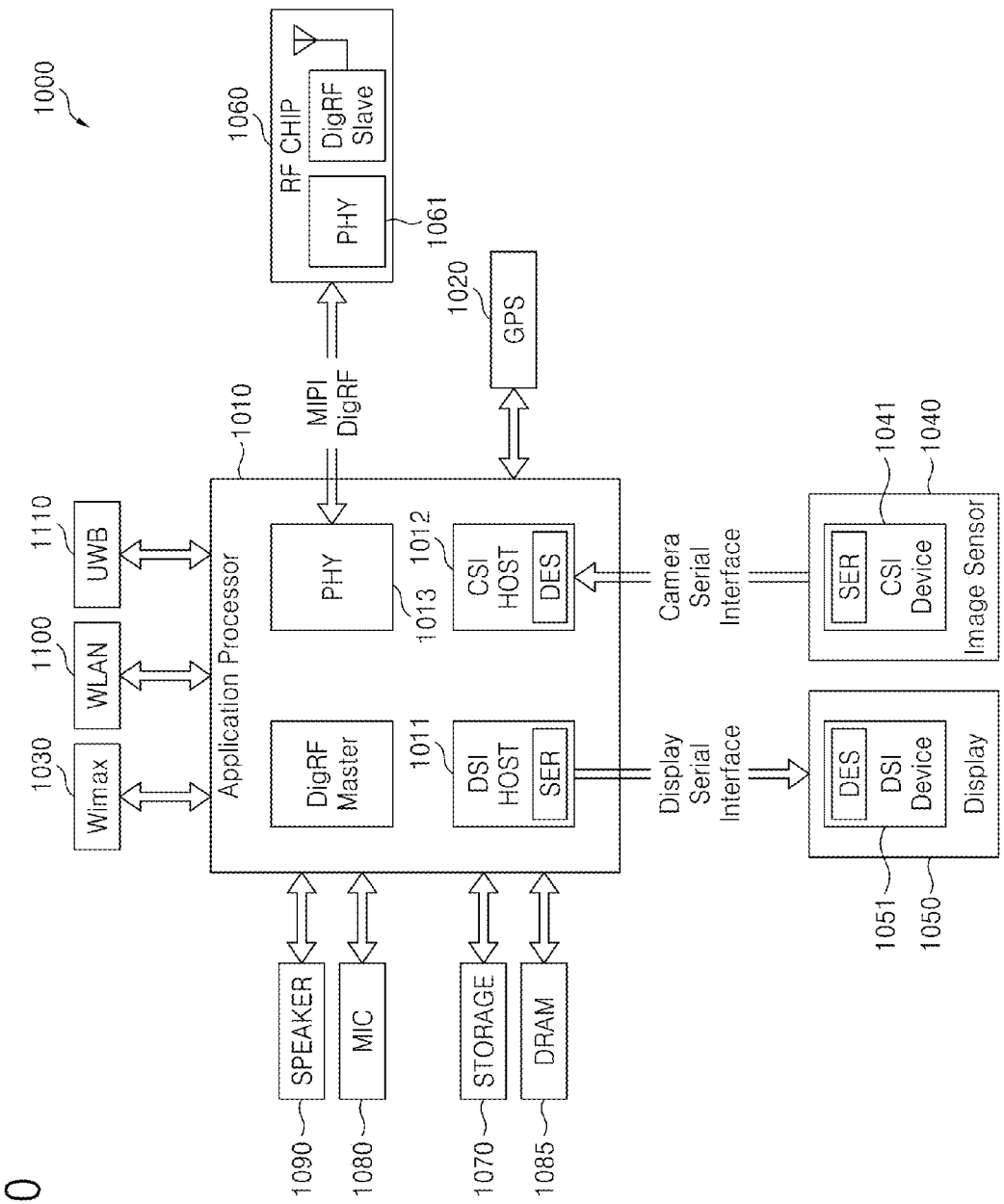
FIG. 10 is a block diagram of an electronic system including an image sensor having the unit pixel according to exemplary embodiments in accordance with principles of inventive concepts.

FIG. 10 is a block diagram of an electronic system including an image sensor having a unit pixel according to exemplary embodiments in accordance with principles of inventive concepts. Referring FIG. 10, the electronic system 1000 may be implemented, for example, as a data processing apparatus, such as a mobile phone, a personal digital assistant (PDA), a portable media player (PMP), an IP TV, or a smart phone that can use or support the MIPI interface. The exemplary embodiment of an electronic system 1000 in accordance with principles of inventive concepts includes an application processor 1010, an image sensor 1040, and a display 1050.

A common systems interface (CSI) host 1012 included in the application processor 1010 performs serial communication with a CSI device 1041 included in the image sensor 1040 through CSI. For example, an optical serializer may be implemented in the CSI host 1012, and an optical de-serializer may be implemented in the CSI device 1041.

A display serial interface (DSI) host 1011 included in the application processor 1010 performs serial communication with a DSI device 1051 included in the display 1050 through DSI. For example, an optical serializer may be implemented in the DSI host 1011, and an optical de-serializer may be implemented in the DSI device 1051.

The electronic system 1000 may also include a radio frequency (RF) chip 1060 which communicates with the application processor 1010. A physical layer (PHY) 1013 of the electronic system 1000 and a PHY of the RF chip 1060 communicate data with each other according to a mobile industry processor interface wireless mobile radio frequency integrated circuit to baseband integrated circuit (MIPI DigRF) standard. The electronic system 1000 may further include at least one element among a global positioning system (GPS) 1020, a storage device 1070, a microphone 1080, a DRAM 1085 and a speaker 1290. The electronic system 1000 may communicate using Wimax 1030, WLAN 1100 or USB 1110, for example.

Figure 11:
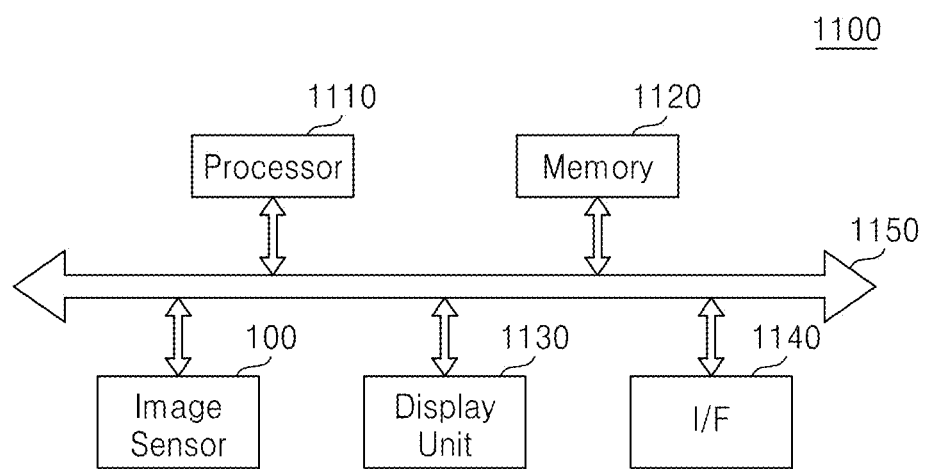
FIG. 11 is a block diagram of an image processing system 1100 including an image sensor having the unit pixel according to exemplary embodiments in accordance with principles of inventive concepts.

FIG. 11 is a block diagram of an image processing system 1100 including an image sensor having the unit pixel according to exemplary embodiments in accordance with principles of inventive concepts. Referring to FIG. 11, the image processing system 1100 may include a processor 1110, a memory 1120, an image sensor 100, a display unit 1130 and an interface 1140.

The processor 1110 may control operations of the image sensor 100. For example, the processor 1110 may generate a two-dimensional (2D) or three-dimensional (3D) image based on at least one of depth information and color information (for example, red information, green information, blue information, magenta information, cyan information, or yellow information).

The memory 1120 may store the generated image and program for controlling the operations of the image sensor 100 via a bus 1150 according to control of the processor 1110. The processor 1110 may access information stored in the memory 1120 and execute the program stored in the memory 1120. The memory 1120 may be implemented as non-volatile memory.

The image sensor 100 may generate two-dimensional (2D) or three-dimensional (3D) image information based on each digital pixel signal (e.g., color information or depth information) according to control of the processor 1110.

The display unit may receive the generated image from the processor 1110 or the memory 1120, and display the image via a display (e.g., LCD, AMOLED).

The interface 1140 may be implemented as an interface for inputting/outputting two-dimensional (2D) or three-dimensional (3D) images and may be implemented as wireless interface, for example.

The inventive concepts can also be embodied as computer-readable codes on a computer-readable medium, which may include any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Additionally, functional programs, codes, and code segments to embody inventive concepts can be readily implemented by programmers.

As described above, according to exemplary embodiments in accordance with principles of inventive concepts, a unit pixel may include only two transistors: a transfer transistor and another transistor, so that the area of the unit pixel is minimized. By minimizing the area of a unit pixel, the resolution of a pixel array may be increased and, by reducing the number of transistors employed in each pixel, the power consumption of the pixel array may be reduced.

While embodiments in accordance with principles of inventive concepts have been shown and described, it will be understood by those of ordinary skill in the art that various changes in forms and details may be made therein without departing from the spirit and scope of inventive concepts, as defined by the following claims.

What is claimed is:

1. A pixel array of an image sensor, the pixel array comprising:
    first and second pixels arranged in a matrix form,
    the first pixel including a first photoelectric conversion element to generate first photocharge varying with the intensity of light incident on the first photoelectric conversion element, a first transfer transistor configured to transfer the first photocharge to a floating diffusion in response to a first transfer control signal, and a first supplemental transistor connected to the floating diffusion; the second pixel including a second photoelectric conversion element configured to generate second photocharge varying with light intensity incident upon the second photoelectric conversion element, a second transfer transistor configured to transfer the second photocharge to the floating diffusion in response to a second transfer control signal, and a second supplemental transistor connected to the floating diffusion, wherein the first pixel and the second pixel are electrically isolated from each other by a deep trench isolation (DTI), wherein the first supplemental transistor is an n-channel depression type transistor and maintains the floating diffusion at 0 V when neither of the first and second pixels is selected.

2. The pixel array of claim 1, wherein the first supplemental transistor is a reset transistor to reset the floating diffusion in response to one of a first reset control signal and a second reset control signal and the second supplemental transistor is a drive transistor configured to output a voltage signal to a source, the voltage signal corresponding to a potential of the floating diffusion.

3. An image sensor comprising the pixel array of claim 1.

4. A pixel array of an image sensor, the pixel array comprising:
    first and second pixels arranged in a matrix form, the first pixel including a first photoelectric conversion element to generate first photocharge varying with the intensity of light incident on the first photoelectric conversion element, a first transfer transistor configured to transfer the first photocharge to a floating diffusion in response to a first transfer control signal and a first supplemental transistor connected to the floating diffusion, the second pixel including a second photoelectric conversion element configured to generate second photocharge varying with light intensity incident upon the second photoelectric conversion element, a second transfer transistor configured to transfer the second photocharge to the floating diffusion in response to a second transfer control signal, and a second supplemental transistor connected to the floating diffusion, wherein the first pixel and the second pixel are electrically isolated from each other by a deep trench isolation (DTI); and
    third and fourth pixels;
    wherein the third pixel includes, a third photoelectric conversion element to generate third photocharge varying with the intensity of incident light, a third transfer transistor configured to transfer the third photocharge to the floating diffusion in response to a third transfer control signal, and a third supplemental transistor connected to the floating diffusion;
    wherein the fourth pixel includes, a fourth photoelectric conversion element to generate fourth photocharge varying with the intensity of incident light, a fourth transfer transistor configured to transfer the fourth photocharge to the floating diffusion in response to a fourth transfer control signal, and a fourth supplemental transistor connected to the floating diffusion; and wherein the first through fourth pixels are electrically isolated from one other by the DTI,
    wherein the second supplemental transistor is a drive transistor configured to output a voltage signal to a source, the voltage signal corresponding to the potential of the floating diffusion; the fourth supplemental transistor is a drive transistor configured to output the voltage signal corresponding to the potential of the floating diffusion to a source; and a gate, drain and source of the second supplemental transistor are respectively connected to a gate, drain and source of the fourth supplemental transistor through a conductive line.

5. The pixel array of claim 4, wherein the first supplemental transistor is a reset transistor to reset the floating diffusion in response to one of first through fourth reset control signals, and the third supplemental transistor is a select transistor to output the voltage signal to a column line in response to one of first through fourth selection control signals.

6. The pixel array of claim 5, wherein the fourth supplemental transistor is a dummy transistor whose gate, drain and source are connected to a ground.

7. The pixel array of claim 6, wherein the first through fourth pixels are arranged in one of a matrix form and a linear form.

8. The pixel array of claim 4, wherein the first through fourth pixels are arranged in one of a matrix form and a linear form.

9. An image processing system, comprising:
    a plurality of unit pixel groups in an image array;
    an analog to digital converter to convert signals supplied by the unit pixels from analog signals to digital signals; and a signal processor to process the digital signals provided by the analog to digital converter, wherein each unit pixel group includes:

a plurality of photoelectric conversion elements configured to generate photocharge varying with the intensity of incident light;

a plurality of transfer transistors to transfer the photocharge from respective photoelectric conversion elements to respective floating diffusions in response to respective transfer control signals;

a plurality of supplemental transistors connected to the respective floating diffusions; and a deep trench isolation (DTI) configured to electrically isolate respective photoelectric conversion elements, transfer transistors, and supplemental transistors from adjacent unit pixels, wherein the supplemental transistor within a third unit pixel within a group of unit pixels is connected in parallel with the supplemental transistor within a second unit pixel as a drive transistor.

10. The image processing system of claim 9, wherein the floating diffusions of unit pixels within a group of unit pixels are electrically connected to and at the same potential as one another.

11. The image processing system of claim 10, wherein the supplemental transistors within a first and the second unit pixels within a group of unit pixels are connected as reset and drive transistors, respectively, for the group of unit pixels.

12. A camera including the image processing system of claim 9.

* * * * *